United States Patent
Sisodia et al.

(10) Patent No.: US 10,734,065 B2
(45) Date of Patent: Aug. 4, 2020

(54) PROVIDING A DISCHARGE BOUNDARY USING BITLINE DISCHARGE CONTROL CIRCUITRY FOR AN INTEGRATED CIRCUIT

(71) Applicant: ARM Limited, Cambridge (GB)

(72) Inventors: Rajiv Kumar Sisodia, Bangalore (IN); Navin Agarwal, Bangalore (IN); Shri Sagar Dwivedi, San Jose, CA (US); Jitendra Dasani, Cupertino, CA (US); Fakhruddin Ali Bohra, Austin, TX (US); Lalit Gupta, Cupertino, CA (US); Daksheshkumar Maganbhai Malaviya, Bangalore (IN)

(73) Assignee: Arm Limited, Cambridge (GB)

( * ) Notice: Subject to any disclaimer, the term of this patent is extended or adjusted under 35 U.S.C. 154(b) by 9 days.

(21) Appl. No.: 15/684,255

(22) Filed: Aug. 23, 2017

(65) Prior Publication Data
US 2019/0066770 A1 Feb. 28, 2019

(51) Int. Cl.
*G11C 11/419* (2006.01)
*G11C 7/12* (2006.01)
*G11C 8/16* (2006.01)

(52) U.S. Cl.
CPC .............. *G11C 11/419* (2013.01); *G11C 7/12* (2013.01); *G11C 8/16* (2013.01)

(58) Field of Classification Search
CPC ........... G11C 11/419; G11C 7/12; G11C 8/16; G11C 11/41
See application file for complete search history.

(56) References Cited

U.S. PATENT DOCUMENTS

| | | | | |
|---|---|---|---|---|
| 6,801,463 | B2* | 10/2004 | Khellah | G11C 7/12 365/154 |
| 7,512,030 | B2* | 3/2009 | Houston | G11C 11/413 365/226 |
| 9,064,556 | B2* | 6/2015 | Gulati | G11C 7/12 |
| 9,685,210 | B1* | 6/2017 | Ghosh | G06F 12/00 |
| 9,824,749 | B1* | 11/2017 | Nautiyal | G11C 11/419 |
| 9,997,217 | B1* | 6/2018 | Goel | G11C 7/12 |
| 2002/0181307 | A1* | 12/2002 | Fifield | G11C 7/062 365/208 |

(Continued)

OTHER PUBLICATIONS

R. Jacob Baker, CMOS Circuit Design, Layout, and Simulation, Third Edition, Chapter 6, 2010.*

*Primary Examiner* — Mushfique Siddique
(74) *Attorney, Agent, or Firm* — Pramudji Law Group PLLC; Ari Pramudji

(57) ABSTRACT

Various implementations described herein are directed to an integrated circuit. The integrated circuit may include read circuitry coupled to bitlines, and the read circuitry may be activated based on a read select signal to perform a read operation on the bitlines. The integrated circuit may include write circuitry coupled to the bitlines, and the write circuitry may be activated based on a write select signal to perform a write operation on the bitlines. The integrated circuit may include bitline discharge control circuitry coupled to the bitlines and the write circuitry, and the bitline discharge control circuitry may control the bitline discharge of the bitlines during the read operation so as to restrict a false read on the bitlines by providing a discharge boundary for the bitlines during the read operation.

18 Claims, 5 Drawing Sheets

(56) References Cited

U.S. PATENT DOCUMENTS

| | | | |
|---|---|---|---|
| 2007/0247896 A1* | 10/2007 | Bhavnagarwala | ............................ G11C 11/4125 365/154 |
| 2010/0002531 A1* | 1/2010 | Lee | ................ G11C 8/16 365/226 |
| 2010/0103755 A1* | 4/2010 | Chen | ................ G11C 7/12 365/203 |
| 2010/0246293 A1* | 9/2010 | Dudeck | ................ G11C 7/04 365/194 |
| 2011/0149667 A1* | 6/2011 | Hamzaoglu | ............ G11C 11/412 365/203 |
| 2012/0014172 A1* | 1/2012 | Jung | ................ G11C 11/413 365/154 |
| 2014/0160840 A1* | 6/2014 | Chen | ................ G11C 5/14 365/182 |
| 2016/0293247 A1* | 10/2016 | Vijayan | ................ G11C 11/419 |
| 2016/0365139 A1* | 12/2016 | Braceras | ................ G11C 11/419 |
| 2019/0198064 A1* | 6/2019 | Gupta | ................ G11C 7/08 |
| 2019/0237135 A1* | 8/2019 | Madhavan | ........... H01L 27/1116 |

* cited by examiner

PROVIDING A DISCHARGE BOUNDARY USING BITLINE DISCHARGE CONTROL CIRCUITRY FOR AN INTEGRATED CIRCUIT

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

At higher core voltages, write failures may occur due to false read when timing mismatch takes place between row and column select lines, even at skewed corners (e.g., when a core voltage VDDC is much larger than a periphery voltage VDDP. For instance, during a write operation, if a wordline signal arrives before a write driver signal, then both the bitline and the complementary bitline may be pulled down to ground (GND), thereby likely inhibiting a write operation on an associated memory bitcell. Also, for pseudo-dual port designs, where the write operation is followed by a read operation in a same cycle, a much higher discharged bitline during read operation may cause the above issue if it is not precharged back before the write operation starts, even if VDDCE=VDDPE. Further, precharging the bitlines back to VDD before the write operation may start impacting the read/write cycle time. In dual port SRAM, the cycle time may be impacted even at the same core voltage and periphery voltage, where simultaneous access is made on a same row but a different column. In this case, when performing a first port A write operation "0" (i.e., writing cored=0 from 1), and/or when performing a second port B dummy read operation, a voltage drop on the read bitline may limit the port B bitline from rising, thus likely causing a write failure to take place. As such, there exists a need to improve circuit designs to reduce possibility and occurrence of false reads.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to bitline discharge control circuitry and various methods related thereto. For instance, in reference to bitline data access, this disclosure provides a bitline discharge control technique that restricts a false read by inhibiting or even preventing discharge of the bitline during a read operation. The bitline discharge control technique unveils a concept of providing a bitline discharge boundary associated with a source voltage level minus a voltage threshold level (i.e., VDD−Vth), which may be sufficient to be sensed by a sense amplifier. In some cases, the bitline discharge control technique may assist in recovery of discharged bitline faster, and hence, this technique may avoid write failures and provide faster cycle times. These features and related advantages are described in greater detail herein below.

Various implementations of read assist circuitry will be described in detail herein with reference to FIGS. 1-5.

Figure 1:
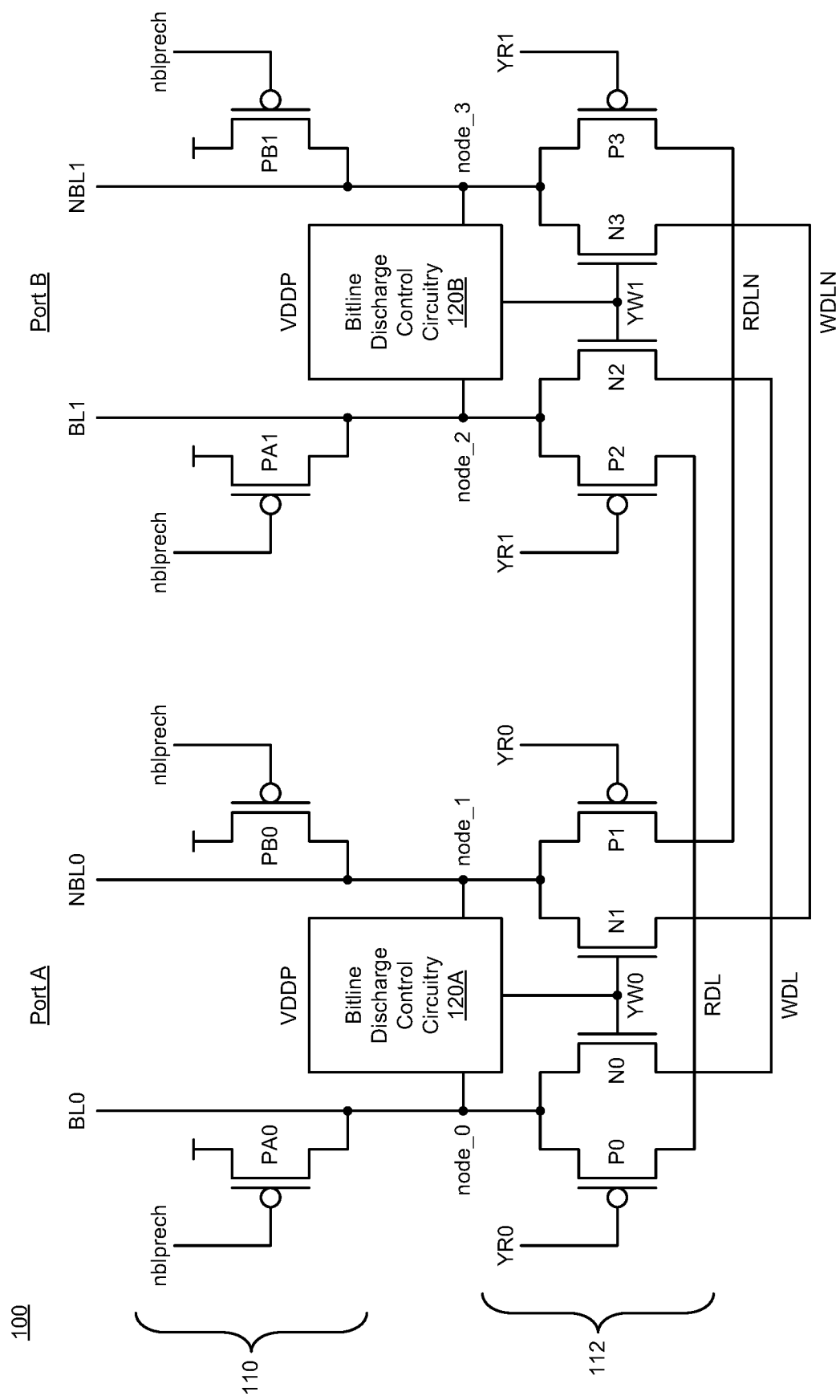
FIG. 1 illustrates a diagram of bitline data access circuitry in accordance with various implementations described herein.

FIG. 1 illustrates a diagram of bitline data access circuitry 100 in accordance with various implementations described herein.

The bitline data access circuitry 100 may be coupled to bitlines (BL, NBL) and implemented as part of memory circuitry in an integrated circuit (IC) that utilizes various types of memory, such as, e.g., random access memory (RAM), including static RAM (SRAM), and/or any other types of volatile memory. In some implementations, the bitline data access circuitry 100 may be implemented as an IC with dual rail memory architecture and related circuitry. In other implementations, the bitline data access circuitry 100 may be integrated with computing circuitry and related components on a single chip. Further, the bitline data access circuitry 100 may be implemented in an embedded system for various electronic and mobile applications, including low power sensor nodes.

The bitlines (BL, NBL) may be coupled to an array of memory cells, and each memory cell may be referred to as a bitcell. Each memory cell may be configured to store at least one data bit value (e.g., a data value related to a logical '0' or '1'). The array of memory cells may be implemented as part of memory circuitry, and the array of memory cells may include any number of memory cells arranged in various configurations, such as, e.g., a two-dimensional (2D) memory array having columns and rows of multiple memory cells arranged in a 2D grid pattern with 2D indexing capabilities.

In some cases, each memory cell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

As shown in FIG. 1, the bitline data access circuitry 100 may include precharge circuitry 110 for precharging the bitlines (BL, NBL) to a source voltage level, such as, e.g., VDD, which may be referred to as a core voltage supply VDDC. The bitlines (BL, NBL) may be referred to as complementary bitlines, and the bitlines (BL, NBL) may be implemented in a dual port memory application, such as, e.g., a first port A with bitlines BL0, NBL0 and a second port B with bitlines BL1, NBL1. The precharge circuitry 110 may precharge the bitlines BL0, NBL0, BL1, NBL1 after a read operation, and the precharge circuitry 110 may include one or more transistors PA0, PB0, PA0, PA1 coupled to the bitlines BL0, NBL0, BL1, NBL1, and the one or more transistors PA0, PB0, PA0, PA1 may be activated based on a precharge activation signal nblprech.

The bitline data access circuitry 100 may include read and write circuitry 112, which may be referred to as read and write select circuitry. The read and write circuitry 112 may include read circuitry having read select transistors P0, P1, P2, P3 coupled to bitlines BL0, NBL0, BL1, NBL1, respectively, and the read select transistors P0, P1, P2, P3 may be activated based on a read select signal YR0, YR1 to perform a read operation on bitlines BL0, NBL0, BL1, NBL1, respectively. As shown in FIG. 1, the read select transistor P0 of the first port A may be coupled to read select transistor P2 of the second port B via a read data line RDL, and read select transistor P1 of the first port A may be coupled to read select transistor P3 of the second port B via another read data line RDLN. The read data lines RDL, RDLN are complementary.

Further, the read and write circuitry 112 may include write circuitry having write select transistors N0, N1, N2, N3 coupled to bitlines BL0, NBL0, BL1, NBL1, respectively, and the write select transistors N0, N1, N2, N3 may be activated based on a write select signal YW0, YW1 to perform a write operation on bitlines BL0, NBL0, BL1, NBL1, respectively. As shown in FIG. 1, write select transistor N0 of the first port A may be coupled to write select transistor N2 of the second port B via a write data line WDL, and write select transistor N1 of the first port A may be coupled to write select transistor N3 of the second port B via another write data line WDLN. The write data lines WDL, WDLN are complementary.

The bitline data access circuitry 100 may include bitline discharge control circuitry 120A, 120B coupled to bitlines BL0, NBL0, BL1, NBL1 and the write select transistors N0, N1, N2, N3 of the write circuitry, respectively. As shown in FIG. 1, the bitline discharge control circuitry 120A may be coupled to bitlines BL0, NBL0 via a first node node_0 and a second node node_1, respectively, and the bitline discharge control circuitry 120B may be coupled to bitlines BL1, NBL1 via a third node node_2 and a fourth node node_3, respectively. The bitline discharge control circuitry 120A, 120B may be used to control the bitline discharge of the bitlines BL0, NBL0, BL1, NBL1 during the read operation so as to restrict a false read on the bitlines BL0, NBL0, BL1, NBL1 by providing a discharge boundary for the bitlines BL0, NBL0, BL1, NBL1, respectively, during the read operation. The discharge boundary may be implemented with the source voltage level VDD minus a threshold voltage level Vth. The bitline discharge control circuitry 120A, 120B may be used to control the bitline discharge in a read cycle, in a read cycle before a write cycle, and/or in a discharge cycle of unselected bitlines. During the read operation, the bitline discharge control circuitry 120A, 120B may control the bitline discharge of the bitlines BL0, NBL0, BL1, NBL1 to not discharge beyond the discharge boundary.

The bitline data access circuitry 100 may operate at a source voltage level VDD with a voltage range that may vary with technology. The source voltage level VDD may be referred to as, e.g., a core voltage supply VDDC. The bitline discharge control circuitry 120A, 120B may operate at a different voltage level, such as, e.g., a periphery voltage level VDDP with a voltage range that may also vary with technology.

In SRAM designs, with VDDC>>VDDP, during a write operation to an opposite state, if the wordline becomes active before the write signal arrives at a "local bit select", then the memory bitcell may be in read mode before the write operation occurs. This may result in a situation where one "local bit line" is pulled down to ground due to a read operation while another "local bit line" is pulled down on arrival of a write signal, which may leave the memory bitcell in a "un-writeable" state. The phenomenon may happen for cases where device and metal capacitance is on the low side, and a passgate threshold voltage Vt is low. Even at lower voltage skews, a low capacitance bitline is pulled low before the write driver is turned on, which may lead to write failures. Therefore, the bitline discharge control technique may be used in SRAM designs to tackle false read, e.g., when targeting margins with a level shift of 400 mv (VDDC=VDDP+400 mV).

In some implementations, the sense amplifier offset is in the range of 100 mV, which means that 100 mV discharge is sufficient for the sense amplifier to resolve. The bitline discharge control technique utilizes this fact and operates to control the bitline discharge in read operations, read operations before write operations, and discharge of unselected bitlines. Some implementations of various techniques described herein may be important for pseudo-dual port designs where the bitline precharges after the read operation, and they may become crucial in defining separation time of the read and write clock which may define the read/write cycle time. During the read operation, the discharging bitline may be forced to not discharge beyond a VDD−Vt level. Some implementations of various techniques described herein may ensure that, during a write operation, the wordline arrives before write driver, and the false read does not discharge the bitline below the VDD−Vt level. Some implementations of various techniques described herein may assist with a quicker recovery of unintended bitline discharge and avoid contention. Some implementations of various techniques described herein may also enable a successful write operation within a same time window. For a pseudo dual port memory, some implementations of various techniques described herein may improve the read-write cycle time by reducing precharge time of the bitline.

Figure 2:
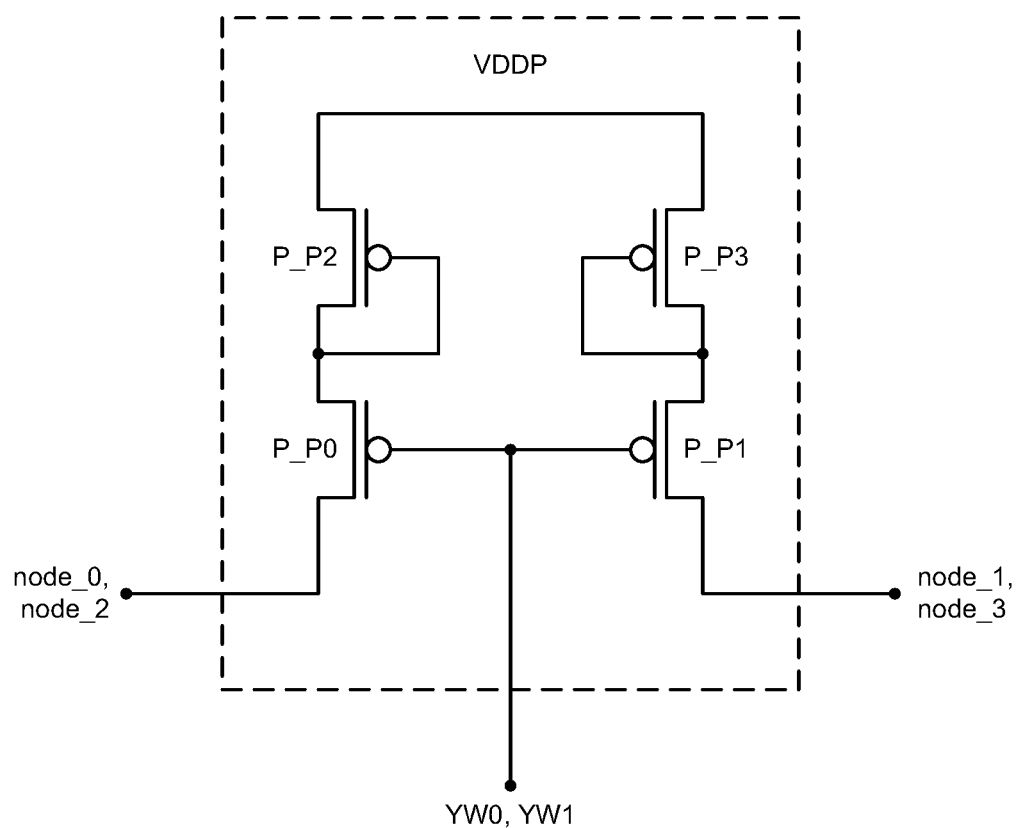
FIGS. 2-4 illustrate various diagrams of bitline discharge control circuitry in accordance with various implementations described herein.
Figure 3:
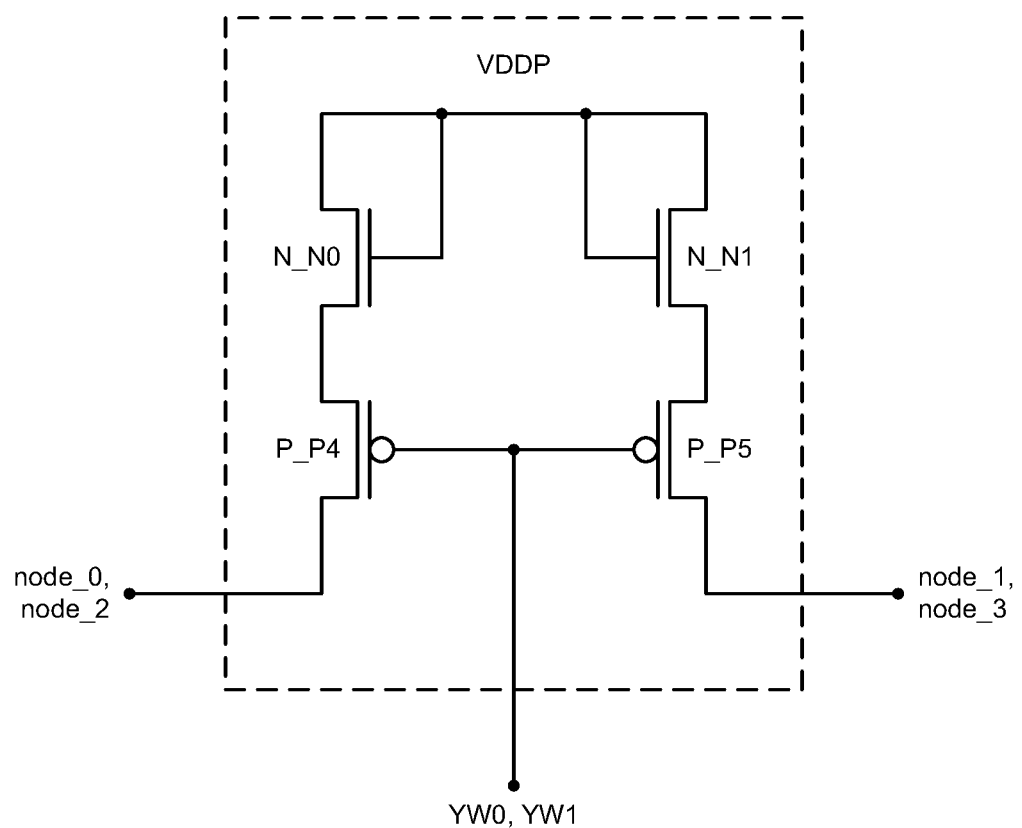
Figure 4:
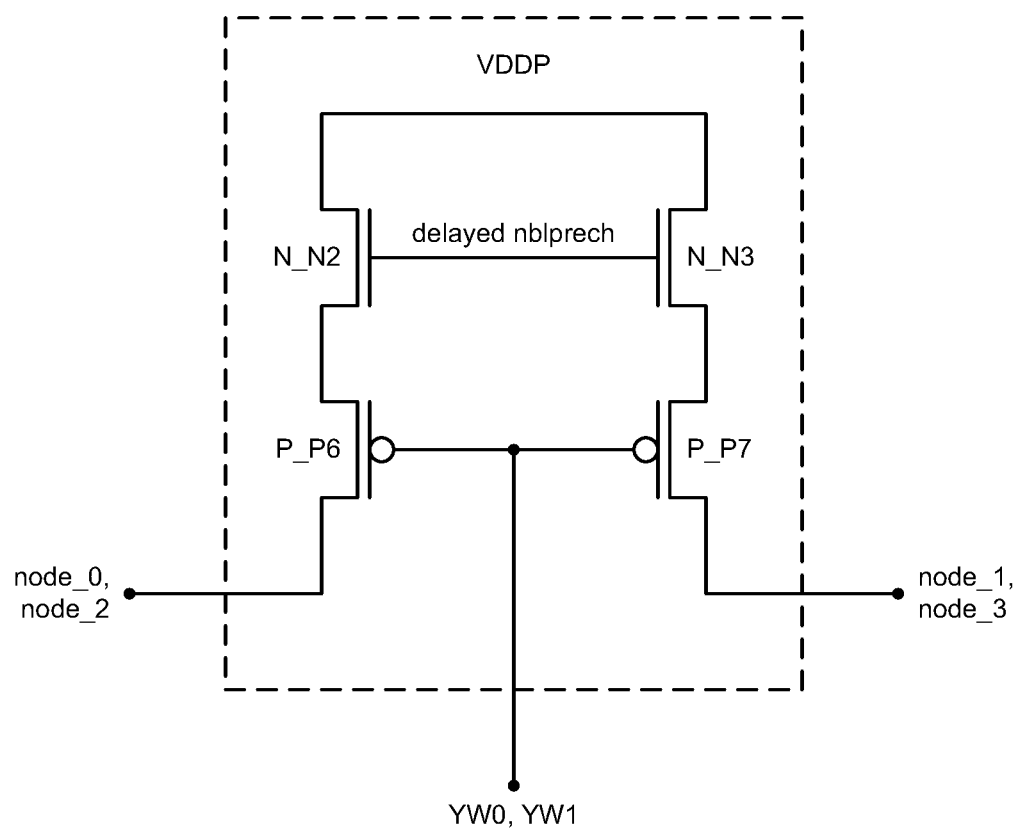

FIGS. 2-4 illustrate various diagrams of bitline discharge control circuitry 220, 320, 420 in accordance with implementations described herein. In particular, FIG. 2 illustrates a first diagram 200 of bitline discharge control circuitry 220, FIG. 3 illustrates a second diagram 300 of bitline discharge control circuitry 320, and FIG. 4 illustrates a third diagram 400 of bitline discharge control circuitry 420. The bitline discharge control circuitry 220, 320, 420 of FIGS. 2-4, respectively, illustrate various implementations of the bitline discharge control circuitry 120A, 120B of FIG. 1. The bitline discharge control circuitry 220, 320, 420 of FIGS. 2-4 may be implemented as an integrated circuit (IC).

As shown in FIGS. 1 and 2, the bitline discharge control circuitry 220 may be implemented with multiple transistors P_P0, P_P1, P_P2, P_P3 coupled to the bitlines BL0, NBL0, BL1, NBL1 via nodes node_0, node_1, node_2, node_3 and the write select transistors N0, N1, N2, N3, respectively. Also, the multiple transistors P_P0, P_P1, P_P2, P_P3 may be arranged to restrict the false read on the bitlines BL0, NBL0, BL1, NBL1 by providing the discharge boundary for the bitlines BL0, NBL0, BL1, NBL1 during the read operation. The multiple transistors P_P0, P_P1, P_P2, P_P3 of the bitline discharge control circuitry 220 may include a first set of transistors P_P0, P_P1 coupled to the bitlines BL0, NBL0, BL1, NBL1 and a second set of transistors P_P2, P_P3 coupled as diodes to provide a diode drop supply. The first set of transistors P_P0, P_P1 may be coupled to the write select transistors N0, N1, N2, N3 and the first set of transistors P_P0, P_P1 may be activated based on the write select signal YW0, YW1, respectively. As shown in FIG. 2, the first and second set of transistors P_P0, P_P1, P_P2, P_P3 may include P-type metal-oxide-semiconductor (PMOS) transistors.

In some implementations, FIG. 2 shows the bitline discharge control circuitry 220 that may limit the bitline discharge beyond the VDD−Vt level. As shown, the circuit 220 may include a PMOS controlled by write column mux signal, YW<3:0>. The PMOS transistors P_P0, P_P1 have their drains coupled to the bitlines BL, NBL and their sources coupled to other PMOS transistors P_P2, P_P3 with their gates coupled to drain in a diode type of configuration. The PMOS transistors P_P2, P_P3 provide a diode drop supply, and this logic structure may be in addition to the bitline precharge circuitry 110, which may be controlled by the precharge activation signal nblprech.

As shown in FIGS. 1 and 3, the bitline discharge control circuitry 320 may be implemented with multiple transistors P_P4, P_P5, N_N0, N_N1 coupled to the bitlines BL0, NBL0, BL1, NBL1 via nodes node_0, node_1, node_2, node_3 and the write select transistors N0, N1, N2, N3, respectively. Also, the multiple transistors P_P4, P_P5, N_N0, N_N1 may be arranged to restrict the false read on the bitlines BL0, NBL0, BL1, NBL1 by providing the discharge boundary for the bitlines BL0, NBL0, BL1, NBL1 during the read operation. The multiple transistors P_P4, P_P5, N_N0, N_N1 of the bitline discharge control circuitry 320 may include a first set of transistors P_P4, P_P5 coupled to the bitlines BL0, NBL0, BL1, NBL1 and a second set of transistors N_N0, N_N1 coupled as diodes to provide a diode drop supply. The first set of transistors P_P4, P_P5 may be coupled to the write select transistors N0, N1, N2, N3 and the first set of transistors P_P4, P_P5 may be activated based on the write select signal YW0, YW1, respectively. The first set of transistors P_P4, P_P5 may include PMOS transistors, and the second set of transistors N_N0, N_N1 may include N-type MOS (NMOS) transistors.

In some implementations, FIG. 3 shows the bitline discharge control circuitry 320 in a similar configuration as FIG. 2, except that the circuitry 320 may generate the diode drop using NMOS transistors N_N0, N_N1 instead of PMOS transistors P_P2, P_P3 as shown in FIG. 2. During an inactive state, the nblprech signal remains low and keeps the bitlines precharged to VDDP. The read mux selection signals (YR<1:0>) are HIGH, and the write mux selection signals (YW<1:0>) are LOW. During a read operation, the YW<3:0> signal remains low, while one of the YR<3:0> goes low. When the wordline goes high, the bitline starts discharging. The bitline does not fall below VDD–Vt, which is sufficient to be sensed by the sense amplifier. During a write operation, one of the YW<3:0> signals goes high. The selected bitline is pulled low through the write driver, and there is no fight from the bitline discharge control circuitry 320. For the remaining bitlines, which may be in a dummy read state, the circuitry 320 operates as during a read operation. During a write operation with VDDC>>VDDP, the bitcell goes into a read mode before a write mode. In conventional designs, the other bitline falls due to the read operation and delays the write operation, which may lead to write failure. However, with the bitline discharge control technique described herein, the other bitline does not fall below the VDD–Vt level and is therefore pulled back up by the cross-coupled PMOS once the actual bitline is pulled low through the write driver.

As shown in FIGS. 1 and 4, the bitline discharge control circuitry 420 may be implemented with multiple transistors P_P6, P_P7, N_N2, N_N3 coupled to the bitlines BL0, NBL0, BL1, NBL1 via nodes node_0, node_1, node_2, node_3 and the write select transistors N0, N1, N2, N3, respectively. Also, the multiple transistors P_P6, P_P7, N_N2, N_N3 may be arranged to restrict the false read on the bitlines BL0, NBL0, BL1, NBL1 by providing the discharge boundary for the bitlines BL0, NBL0, BL1, NBL1 during the read operation. The multiple transistors P_P6, P_P7, N_N2, N_N3 of the bitline discharge control circuitry 420 may include a first set of transistors P_P6, P_P7 coupled to the bitlines BL0, NBL0, BL1, NBL1 and a second set of transistors N_N2, N_N3 having gates coupled together. In some cases, having the gates of the second set of transistors N_N2, N_N3 coupled together may have a delayed precharge signal nblprech. The first set of transistors P_P6, P_P7 may be coupled to the write select transistors N0, N1, N2, N3 and the first set of transistors P_P6, P_P7 may be activated based on the write select signal YW0, YW1, respectively.

In some implementations, FIG. 4 shows the bitline discharge control circuitry 420 in a different configuration than FIGS. 2 and 3. For instance, the circuits 220, 320 of FIG. 2, 3 may cause a high power in the read and write cycle, e.g., when the wordline remains high for a substantially long period of time. This may occur because the wordline pulsewidth may be high leading to high current during this time. The circuitry 420 of FIG. 4 provides an enhancement that may improve performance by allowing the VDD–Vtn precharge to remain enabled for a small time. Thus, the circuitry 420 may inhibit or even prevent a false read, especially when VDDC>>VDDP. For instance, in a write cycle, the circuitry 420 may provide that the unwanted bitline does not fall below VDD–Vtn before the data accessed bitline is pulled low, thus inhibiting a false read. In a read cycle, the circuitry 420 may allow the bitline to discharge up to the VDD–Vtn level, so as to not impact a voltage differential VDIFF generation.

Figure 5:
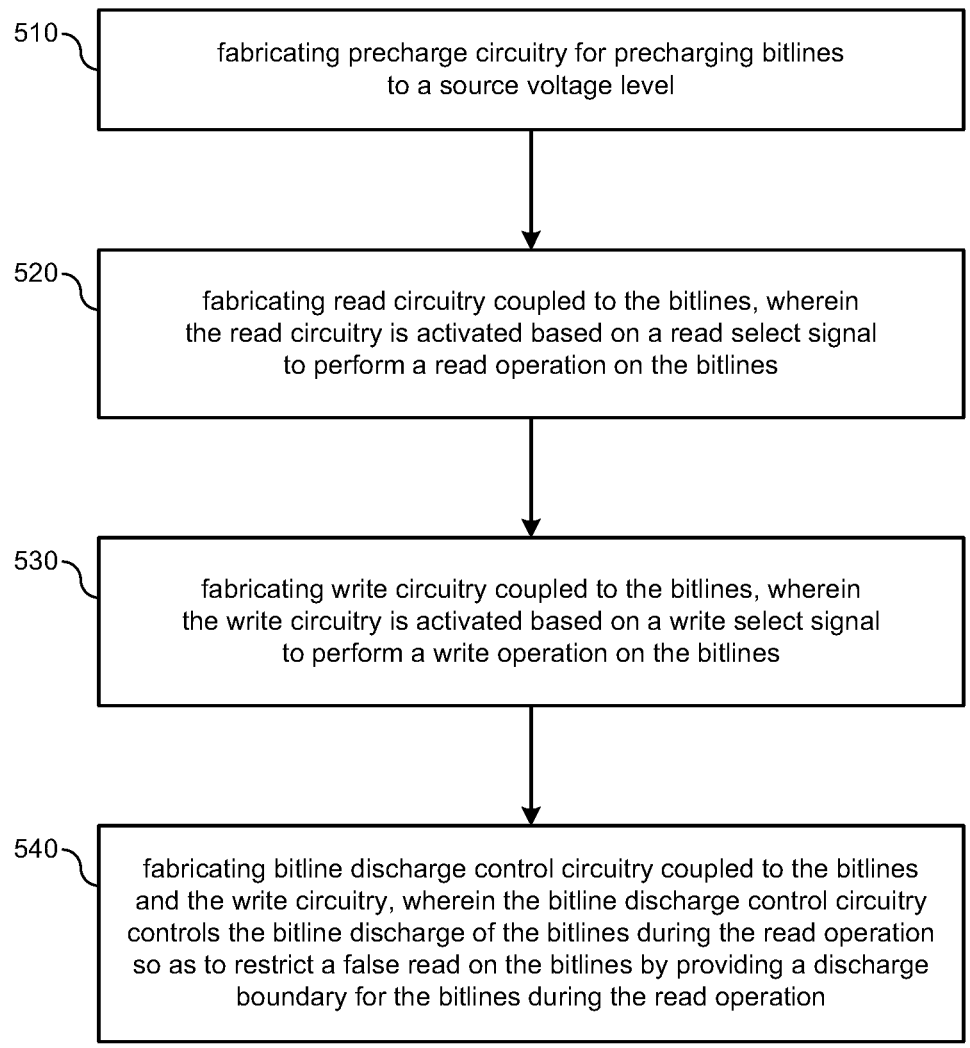
FIG. 5 illustrates a process flow of a method for fabricating bitline discharge control circuitry in accordance with various implementations described herein.

FIG. 5 illustrates a process flow diagram of a method 500 for fabricating bitline discharge control circuitry in accordance with implementations described herein.

It should be understood that even though method 500 may indicate a particular order of operation execution, various certain portions of the operations may be executed in a different order, and on different systems. Additional operations and/or steps may be added to and/or omitted from method 500. Method 500 may be implemented in hardware and/or software. If implemented in hardware, the method 500 may be implemented with various circuit components, such as described herein above in reference to FIGS. 1-4. If implemented in software, method 500 may be implemented as a program or software instruction process that is configured for implementing bitline discharge control circuitry as described herein above. Further, if implemented in software, instructions related to implementing method 500 may be stored or recorded in memory. As such, a computer, a server, or any other types of computing devices having a processor and memory may be configured to perform the method 500.

In reference to FIG. 5, method 500 may be utilized for fabricating, designing, and/or manufacturing integrated circuitry or an integrated circuit having bitline discharge control circuitry for memory applications.

In some implementations, at block 510, method 500 may fabricate precharge circuitry for precharging bitlines to a source voltage level. The precharge circuitry may be implemented to precharge the bitlines after the read operation. The precharge circuitry may include one or more transistors coupled to the bitlines, and the one or more transistors may be activated based on a precharge activation signal.

At block 520, method 500 may fabricate read circuitry coupled to the bitlines, and the read circuitry may be activated based on a read select signal to perform a read operation on the bitlines. The read circuitry may include read select transistors coupled to the bitlines, and the read select transistors may be activated based on the read select signal to perform the read operation on the bitlines.

At block 530, method 500 may fabricate write circuitry coupled to the bitlines, and the write circuitry may be activated based on a write select signal to perform a write operation on the bitlines. The write circuitry may include write select transistors coupled to the bitlines, and the write select transistors may be activated based on the write select signal to perform the write operation on the bitlines.

At block 540, method 500 may fabricate bitline discharge control circuitry coupled to the bitlines and the write circuitry, and the bitline discharge control circuitry controls the bitline discharge of the bitlines during the read operation so as to restrict a false read on the bitlines by providing a discharge boundary for the bitlines during the read operation. The discharge boundary may include the source voltage level (e.g., VDD or VDDP) minus a threshold voltage level (e.g., Vth). The bitline discharge control circuitry may control the bitline discharge in a read cycle, in a read cycle before a write cycle, and/or in a discharge cycle of unselected bitlines. During the read operation, the bitline discharge control circuitry may control the bitline discharge of the bitlines to not discharge beyond the discharge boundary.

Described herein are various implementations of an integrated circuit. The integrated circuit may include read circuitry coupled to bitlines, and the read circuitry may be activated based on a read select signal to perform a read operation on the bitlines. The integrated circuit may include write circuitry coupled to the bitlines, and the write circuitry may be activated based on a write select signal to perform a write operation on the bitlines. The integrated circuit may include bitline discharge control circuitry coupled to the bitlines and the write circuitry, and the bitline discharge control circuitry may control the bitline discharge of the bitlines during the read operation so as to restrict a false read on the bitlines by providing a discharge boundary for the bitlines during the read operation.

Described herein are various implementations of an integrated circuit. The integrated circuit may include precharge circuitry for precharging bitlines to a source voltage level. The precharge circuitry may include one or more transistors coupled to the bitlines that are activated based on a precharge activation signal. The integrated circuit may include read and write select circuitry having read select transistors coupled to the bitlines and write select transistors coupled to the bitlines. The read select transistors may be activated based on a read select signal to perform a read operation on the bitlines, and the write select transistors may be activated based on a write select signal to perform a write operation on the bitlines. The integrated circuit may include bitline discharge control circuitry having multiple transistors coupled to the bitlines and the write select transistors. The multiple transistors may be arranged to restrict a false read on the bitlines by providing a discharge boundary for the bitlines during the read operation.

Described herein are various implementations of a method for manufacturing an integrated circuit. The method may include fabricating precharge circuitry for precharging bitlines to a source voltage level. The method may include fabricating read circuitry coupled to the bitlines, and the read circuitry may be activated based on a read select signal to perform a read operation on the bitlines. The method may include fabricating write circuitry coupled to the bitlines, and the write circuitry may be activated based on a write select signal to perform a write operation on the bitlines. The method may include fabricating bitline discharge control circuitry coupled to the bitlines and the write circuitry. The bitline discharge control circuitry may control the bitline discharge of the bitlines during the read operation so as to restrict a false read on the bitlines by providing a discharge boundary for the bitlines during the read operation.

In some implementations, the bitline discharge control circuitry may include multiple transistors coupled to the bitlines and the write select transistors, and the multiple transistors may be arranged to restrict the false read on the bitlines by providing the discharge boundary for the bitlines during the read operation. The multiple transistors of the bitline discharge control circuitry may include a first set of transistors coupled to the bitlines and a second set of transistors coupled as diodes to provide a diode drop supply. The first set of transistors may be coupled to the write select transistors, and the first set of transistors may be activated based on the write select signal. In some cases, the first and second set of transistors may be implemented with PMOS transistors. In other cases, the first set of transistors may be implemented with PMOS transistors, and the second set of transistors may be implemented with NMOS transistors. In still other cases, the second set of transistors may have gates that are coupled together.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   read circuitry coupled to bitlines, wherein the read circuitry is activated based on a read select signal to perform a read operation on the bitlines;
   write circuitry coupled to the bitlines, wherein the write circuitry is activated based on a write select signal to perform a write operation on the bitlines; and
   bitline discharge control circuitry coupled to the bitlines and the write circuitry,
   wherein the bitline discharge control circuitry controls the bitline discharge of the bitlines during the read operation so as to restrict a false read on the bitlines by providing a discharge boundary for the bitlines during the read operation,
   wherein the bitline discharge control circuitry comprises a first set of transistors and a second set of transistors, wherein the second set of transistors is coupled as diodes between a voltage supply and the first set of transistors, and
   wherein the first set of transistors is coupled between the bitlines and the second set of transistors, wherein the first set of transistors have drains connected to the bitlines, and wherein the first set of transistors is configured to be activated based on the write select signal.

2. The integrated circuit of claim 1, further comprising:
   precharge circuitry for precharging bitlines to a source voltage level, wherein the precharge circuitry precharges the bitlines after the read operation, and wherein the precharge circuitry comprises one or more transistors coupled to the bitlines that are activated based on a precharge activation signal.

3. The integrated circuit of claim 1, wherein the discharge boundary comprises the source voltage level minus a threshold voltage level.

4. The integrated circuit of claim 1, wherein the bitline discharge control circuitry controls the bitline discharge in a read cycle, in a read cycle before a write cycle, or in a discharge cycle of unselected bitlines.

5. The integrated circuit of claim 1, wherein the read circuitry comprises read select transistors coupled to the bitlines, and wherein the read select transistors are activated based on the read select signal to perform the read operation on the bitlines.

6. The integrated circuit of claim 1, wherein the write circuitry comprises write select transistors coupled to the bitlines, and wherein the write select transistors are activated based on the write select signal to perform the write operation on the bitlines.

7. The integrated circuit of claim 6, wherein the first set of transistors and the second set of transistors are coupled to the bitlines, and wherein the first set of transistors and the second set of transistors are arranged to restrict the false read on the bitlines by providing the discharge boundary for the bitlines during the read operation.

8. An integrated circuit, comprising:
   read circuitry coupled to bitlines, wherein the read circuitry is activated based on a read select signal to perform a read operation on the bitlines;
   write circuitry having write select transistors coupled to the bitlines, wherein the write select transistors are activated based on a write select signal to perform a write operation on the bitlines; and
   bitline discharge control circuitry coupled to the bitlines and the write circuitry, wherein the bitline discharge control circuitry controls the bitline discharge of the bitlines during the read operation so as to restrict a false read on the bitlines by providing a discharge boundary for the bitlines during the read operation,
   wherein the bitline discharge control circuitry comprises multiple transistors coupled to the bitlines and the write select transistors, and wherein the multiple transistors are arranged to restrict the false read on the bitlines by providing the discharge boundary for the bitlines during the read operation,
   wherein the multiple transistors of the bitline discharge control circuitry comprise a first set of transistors and a second set of transistors, wherein the second set of transistors is coupled as diodes to provide a diode drop supply, and
   wherein the first set of transistors is coupled between the bitlines and the second set of transistors, and wherein the first set of transistors is activated based on the write select signal.

9. The integrated circuit of claim 8, wherein the first set of transistors is coupled to the write select transistors.

10. The integrated circuit of claim 8, wherein the first set of transistors and the second set of transistors comprise P-type metal-oxide-semiconductor (PMOS) transistors.

11. The integrated circuit of claim 8, wherein the first set of transistors comprises P-type metal-oxide-semiconductor (PMOS) transistors, and wherein the second set of transistors comprises N-type metal-oxide-semiconductor (NMOS) transistors.

12. An integrated circuit, comprising:
   read circuitry coupled to bitlines, wherein the read circuitry is activated based on a read select signal to perform a read operation on the bitlines;
   write circuitry coupled to the bitlines, wherein the write circuitry is activated based on a write select signal to perform a write operation on the bitlines; and bitline discharge control circuitry coupled to the bitlines and the write circuitry, the bitline discharge control circuitry comprising a first set of transistors and a second set of transistors, wherein the first set of transistors is coupled between the bitlines and the second set of transistors, wherein the first set of transistors is activated based on the write select signal, and wherein the second set of transistors has gates coupled together to receive a delayed bitline precharge signal.

13. An integrated circuit, comprising:

precharge circuitry for precharging bitlines to a source voltage level, wherein the precharge circuitry comprises one or more transistors coupled to the bitlines that are activated based on a precharge activation signal;

read and write select circuitry having read select transistors coupled to the bitlines and write select transistors coupled to the bitlines, wherein the read select transistors are activated based on a read select signal to perform a read operation on the bitlines, and wherein the write select transistors are activated based on a write select signal to perform a write operation on the bitlines; and bitline discharge control circuitry having multiple transistors coupled to the bitlines and the write select transistors, wherein the multiple transistors are arranged to restrict a false read on the bitlines by providing a discharge boundary for the bitlines during the read operation, wherein the multiple transistors of the bitline discharge control circuitry comprise a first set of transistors and a second set of transistors, wherein the first set of transistors is coupled between the bitlines and the second set of transistors, wherein the first set of transistors is activated based on the write select signal, and wherein the second set of transistors is coupled as diodes to provide a diode drop supply.

14. The integrated circuit of claim 13, wherein the first set of transistors is coupled to the write select transistors.

15. The integrated circuit of claim 13, wherein the first set of transistors and the second set of transistors comprise P-type metal-oxide-semiconductor (PMOS) transistors.

16. The integrated circuit of claim 13, wherein the first set of transistors comprises P-type metal-oxide-semiconductor (PMOS) transistors, and wherein the second set of transistors comprises N-type metal-oxide-semiconductor (NMOS) transistors.

17. The integrated circuit of claim 13, wherein the first set of transistors is coupled to the bitlines, and wherein the second set of transistors has gates coupled together to receive a delayed bitline precharge signal.

18. A method for manufacturing an integrated circuit, the method comprising:

fabricating precharge circuitry for precharging bitlines to a source voltage level;

fabricating read circuitry coupled to the bitlines, wherein the read circuitry is activated based on a read select signal to perform a read operation on the bitlines;

fabricating write circuitry coupled to the bitlines, wherein the write circuitry is activated based on a write select signal to perform a write operation on the bitlines; and fabricating bitline discharge control circuitry coupled to the bitlines and the write circuitry, wherein the bitline discharge control circuitry controls the bitline discharge of the bitlines during the read operation so as to restrict a false read on the bitlines by providing a discharge boundary for the bitlines during the read operation, wherein the bitline discharge control circuitry comprises a first set of transistors and a second set of transistors, wherein the first set of transistors is coupled between the bitlines and the second set of transistors, wherein the first set of transistors is activated based on the write select signal, and wherein the second set of transistors is coupled as diodes between a voltage supply and the first set of transistors.

* * * * *